United States Patent
Ogashiwa et al.

(10) Patent No.: US 9,480,164 B2
(45) Date of Patent: Oct. 25, 2016

(54) RESIN COMPOSITION, PREPREG, AND LAMINATE

(75) Inventors: Takaaki Ogashiwa, Tokyo (JP); Hiroshi Takahashi, Tokyo (JP); Tetsuro Miyahira, Tokyo (JP); Yoshihiro Kato, Tokyo (JP)

(73) Assignee: MITSUBISHI GAS CHEMICAL COMPANY, INC., Tokyo (JP)

( * ) Notice: Subject to any disclaimer, the term of this patent is extended or adjusted under 35 U.S.C. 154(b) by 417 days.

(21) Appl. No.: 14/122,073

(22) PCT Filed: May 29, 2012

(86) PCT No.: PCT/JP2012/063740
§ 371 (c)(1),
(2), (4) Date: Jan. 15, 2014

(87) PCT Pub. No.: WO2012/165423
PCT Pub. Date: Dec. 6, 2012

(65) Prior Publication Data
US 2014/0227531 A1    Aug. 14, 2014

(30) Foreign Application Priority Data

May 31, 2011 (JP) ................................. 2011-121923

(51) Int. Cl.
| | |
|---|---|
| B32B 27/38 | (2006.01) |
| H05K 3/00 | (2006.01) |
| C08G 73/06 | (2006.01) |
| C08L 79/04 | (2006.01) |
| C08L 79/08 | (2006.01) |
| H05K 1/03 | (2006.01) |
| C08J 5/24 | (2006.01) |
| B32B 5/02 | (2006.01) |
| B32B 15/14 | (2006.01) |
| B32B 15/20 | (2006.01) |
| C08K 5/3445 | (2006.01) |
| C08K 5/29 | (2006.01) |
| C08K 5/3415 | (2006.01) |

(52) U.S. Cl.
CPC .............. *H05K 3/0061* (2013.01); *B32B 5/024* (2013.01); *B32B 15/14* (2013.01); *B32B 15/20* (2013.01); *C08G 73/0655* (2013.01); *C08J 5/24* (2013.01); *C08L 79/04* (2013.01); *C08L 79/085* (2013.01); *H05K 1/0326* (2013.01); *H05K 1/0346* (2013.01); *B32B 2255/02* (2013.01); *B32B 2255/26* (2013.01); *B32B 2260/021* (2013.01); *B32B 2260/046* (2013.01); *B32B 2262/101* (2013.01); *B32B 2264/102* (2013.01); *B32B 2307/51* (2013.01); *B32B 2457/00* (2013.01); *C08J 2379/04* (2013.01); *C08J 2379/08* (2013.01); *C08K 5/29* (2013.01); *C08K 5/3415* (2013.01); *C08K 5/3445* (2013.01); *H05K 2201/0209* (2013.01); *H05K 2201/0355* (2013.01); *Y10T 156/10* (2015.01); *Y10T 428/31529* (2015.04)

(58) Field of Classification Search
CPC ...... C08L 79/04; C08L 63/00; C08L 79/085; H05K 1/0346; H05K 2201/0209; B32B 15/20; B32B 2264/102; B32B 2260/046; B32B 2255/26; C08K 3/033; C08K 5/29; C08J 2379/04; Y10T 428/31529
USPC .......................................................... 428/418
See application file for complete search history.

(56) References Cited

U.S. PATENT DOCUMENTS

| | | |
|---|---|---|
| 2004/0155364 A1 | 8/2004 | Doba et al. |
| 2009/0017316 A1 | 1/2009 | Kato et al. |
| 2009/0203279 A1* | 8/2009 | Mori .................... C08G 65/44 442/233 |
| 2012/0018072 A1 | 1/2012 | Ueno et al. |

FOREIGN PATENT DOCUMENTS

| | | |
|---|---|---|
| EP | 1961554 | 8/2008 |
| JP | 63-033472 | 2/1988 |
| JP | 11-124433 | 5/1999 |
| JP | 2003-502484 | 1/2003 |
| JP | 2003-531941 | 10/2003 |
| JP | 2009-024056 | 2/2009 |
| JP | 2009-035728 | 2/2009 |
| JP | 2010-100803 | 5/2010 |
| JP | 2010-109861 | 9/2010 |
| TW | 200942578 | 10/2009 |
| TW | 201038669 | 11/2010 |
| WO | 01-83607 | 11/2001 |
| WO | 2010/098037 | 9/2010 |

OTHER PUBLICATIONS

STIC Search Report dated Mar. 18, 2016.*
International Search Report issued Sep. 4, 2012 in PCT/JP2012/063740.

* cited by examiner

*Primary Examiner* — Eisa Elhilo
(74) *Attorney, Agent, or Firm* — Greenblum & Bernstein, P.L.C.

(57) ABSTRACT

It is an object of the present invention to provide, without using a halogenated compound or a phosphorus compound, a resin composition for printed wiring boards, a prepreg, a laminate, and a metal foil-clad laminate, each of which has high-degree flame retardance, has a low water absorption ratio and a high glass transition temperature, and has a high elastic modulus at high temperature.

A resin composition according to the present invention includes a specific maleimide compound (A); a cyanate ester compound (B); a non-halogen epoxy resin (C); and an inorganic filler (D).

34 Claims, No Drawings

RESIN COMPOSITION, PREPREG, AND LAMINATE

TECHNICAL FIELD

The present invention relates to a resin composition. In particular, the present invention relates to a resin composition which can be suitably used in a printed wiring board. Furthermore, the present invention relates to a prepreg, a laminate, and a metal foil-clad laminate which are produced using the resin composition.

BACKGROUND ART

With increasing high functionalization and miniaturization of semiconductor packages which are widely used for electronic equipment, communication apparatuses, and personal computers or the like, in recent years, high integration and high-density packaging have been increasingly accelerated. As a result, requirements to a laminate used for the semiconductor package are also various, and characteristics such as flame retardance and low water absorption according to standardization of halogen-phosphorus free, lead free of solder are required from consideration to environmental problems.

It has been known that a coefficient of thermal expansion in the plane direction of the laminate at a temperature higher than a glass transition point is different from that at a temperature lower than the glass transition point, and the coefficient of thermal expansion is decreased immediately after exceeding the glass transition point. Because a plastic package is heated to 260° C. or more by solder reflow processing or the like in a producing process, the difference between the coefficients of thermal expansion in the plane direction is increased between the laminate and a sealing resin or the like by the declination of the coefficient of thermal expansion described above when the glass transition temperature of the laminate is low, which causes production faults such as warpage. Therefore, a high glass transition temperature is required for the laminate. In order to suppress a shape change caused by the coefficient of thermal expansion of the sealing resin, a high elastic modulus at high temperature is also required.

In a technique of raising the glass transition temperature of the laminate, an ingredient having a high glass transition temperature is used for a resin composition for the laminate (for example, see Patent Literature 1). Novolac-based bismaleimide is used as the resin ingredient raising the glass transition temperature in Patent Literature 1. However, because the glass transition temperature of other resin ingredient is low, it is difficult to attain the glass transition temperature of 260° C. or more. In order to attain the glass transition temperature of 260° C. or more, it is necessary to increase the amount of an inorganic filler used. In this case, the moldability is easily predicted to be poor.

As another technique, the blending of a cyanate ester resin and bismaleimide has been known. Many case examples using a novolac-based cyanate ester resin particularly as a cyanate ester compound can be found (for example, see Patent Literature 2). However, the novolac-based cyanate ester resin is apt to be insufficiently cured in a normal curing condition. The obtained cured product disadvantageously has a large water absorption ratio.

CITATION LIST

Patent Literature

Patent Literature 1: Japanese Patent Laid-Open No. 2010-100803

Patent Literature 2: Japanese Patent Laid-Open No. 11-124433

SUMMARY OF INVENTION

Technical Problem

It is an object of the present invention to provide, without using a halogenated compound or a phosphorus compound, a resin composition for printed wiring boards which has high-degree flame retardance, has a low water absorption ratio and a high glass transition temperature, and has a high elastic modulus at high temperature, a prepreg containing the resin composition, and a laminate and a metal foil-clad laminate which contain the prepreg.

Solution to Problem

The present inventors have found that a metal foil-clad laminate obtained by blending a maleimide compound having a specific structure, a cyanate ester compound, an epoxy resin, and an inorganic filler as a resin composition for printed wiring boards, or by blending an epoxy resin, an inorganic filler, and a BT resin obtained by prepolymerizing a maleimide compound having a specific structure and a cyanate ester compound has excellent flame retardance, low water absorption, a high glass transition temperature, and an excellent elastic modulus at high temperature. On the basis of these findings, the present inventors have completed the present invention.

That is, the following inventions of 1 to 29 are provided.

1. A resin composition comprising:
a maleimide compound (A) represented by general formula (1):

[Formula 1]

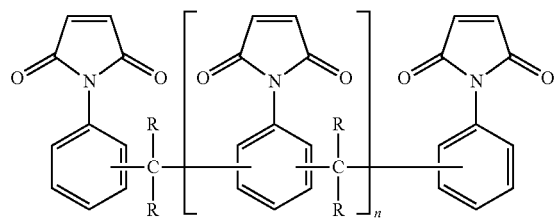

wherein R represents a hydrogen atom or a methyl group, and n represents an integer of 1 to 10 on average;
a cyanate ester compound (B);
a non-halogen epoxy resin (C); and
an inorganic filler (D).

2. The resin composition according to 1, further comprising an imidazole compound (F) represented by general formula (3):

[Formula 2]

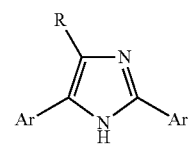

wherein Ar is a phenyl group, a naphthalene group, a biphenyl group, an anthracene group, or a hydroxyl group modified substance thereof, and R is a hydrogen atom, an alkyl group, an aryl group, or a hydroxyl group modified substance thereof.

3. The resin composition according to 1 or 2, wherein a content of the maleimide compound (A) is 10 to 50 parts by mass based on 100 parts by mass in total of the maleimide compound (A), the cyanate ester compound (B), and the non-halogen epoxy resin (C).

4. The resin composition according to any one of 1 to 3, wherein a content of the cyanate ester compound (B) is 10 to 50 parts by mass based on 100 parts by mass in total of the maleimide compound (A), the cyanate ester compound (B), and the non-halogen epoxy resin (C).

5. The resin composition according to any one of 1 to 4, wherein a content of the non-halogen epoxy resin (C) is 5 to 50 parts by mass based on 100 parts by mass in total of the maleimide compound (A), the cyanate ester compound (B), and the non-halogen epoxy resin (C).

6. The resin composition according to any one of 1 to 5, wherein a content of the inorganic filler (D) is 50 to 400 parts by mass based on 100 parts by mass in total of the maleimide compound (A), the cyanate ester compound (B), and the non-halogen epoxy resin (C).

7. The resin composition according to any one of 2 to 6, wherein a content of the imidazole compound (F) is 0.01 to 10 parts by mass based on 100 parts by mass in total of the maleimide compound (A), the cyanate ester compound (B), and the non-halogen epoxy resin (C).

8. A resin composition comprising:
a non-halogen epoxy resin (C);
an inorganic filler (D); and
a BT resin (E) obtained by prepolymerizing a maleimide compound (A) and a cyanate ester compound (B), the maleimide compound (A) represented by general formula (1):

[Formula 3]

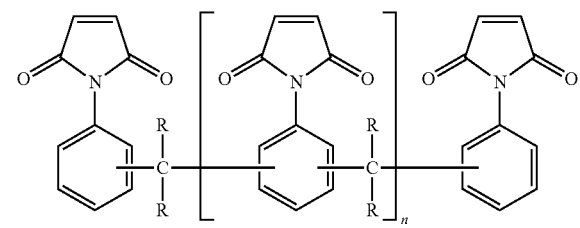

(1)

wherein R represents a hydrogen atom or a methyl group, and n represents an integer of 1 to 10 on average.

9. The resin composition according to 8, further comprising an imidazole compound (F) represented by general formula (3):

[Formula 4]

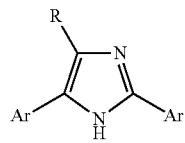

(3)

wherein Ar is a phenyl group, a naphthalene group, a biphenyl group, an anthracene group, or a hydroxyl group modified substance thereof, and R is a hydrogen atom, an alkyl group, an aryl group, or a hydroxyl group modified substance thereof.

10. The resin composition according to 8 or 9, wherein a content of the non-halogen epoxy resin (C) is 5 to 50 parts by mass based on 100 parts by mass in total of the non-halogen epoxy resin (C) and the BT resin (E).

11. The resin composition according to any one of 8 to 10, wherein a content of the inorganic filler (D) is 50 to 400 parts by mass based on 100 parts by mass in total of the non-halogen epoxy resin (C) and the BT resin (E).

12. The resin composition according to any one of 8 to 11, wherein a content of the BT resin (E) is 20 to 80 parts by mass based on 100 parts by mass in total of the non-halogen epoxy resin (C) and the BT resin (E).

13. The resin composition according to any one of 8 to 12, wherein a content of the maleimide compound (A) is 5 to 75 parts by mass based on 100 parts by mass of the BT resin (E) when the BT resin (E) is produced.

14. The resin composition according to any one of 9 to 13, wherein a content of the imidazole compound (F) is 0.01 to 10 parts by mass based on 100 parts by mass in total of the non-halogen epoxy resin (C) and the BT resin (E).

15. The resin composition according to any one of 2 to 7 and 9 to 14, wherein the imidazole compound (F) is 2,4,5-triphenyl imidazole.

16. The resin composition according to any one of 1 to 15, wherein the inorganic filler (D) is at least one selected from the group consisting of silica, boehmite, magnesium hydroxide, alumina, and talc.

17. The resin composition according to any one of 1 to 16, wherein the inorganic filler (D) is the boehmite and/or the silica.

18. The resin composition according to any one of 1 to 17, wherein the non-halogen epoxy resin (C) is at least one selected from the group consisting of a phenol biphenyl aralkyl-based epoxy resin, a phenol novolac-based epoxy resin, a cresol novolac-based epoxy resin, a polyoxynaphthylene-based epoxy resin, a tetrafunctional naphthalene-based epoxy resin, and an anthracene-based epoxy resin.

19. The resin composition according to any one of 1 to 18, wherein the cyanate ester compound (B) is a naphthol aralkyl-based cyanate ester compound and/or a novolac-based cyanate ester compound.

20. The resin composition according to any one of 1 to 19, wherein the cyanate ester compound (B) is a naphthol aralkyl-based cyanate ester compound represented by general formula (2):

[Formula 5]

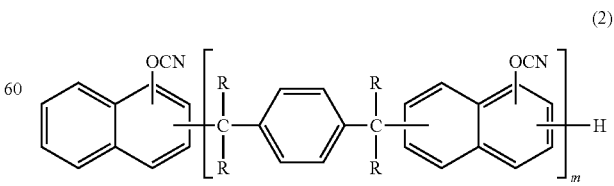

(2)

wherein R represents a hydrogen atom or a methyl group, and m represents an integer of 1 to 10 on average.

21. The resin composition according to any one of 1 to 20 used for a cured product having a glass transition temperature of 260 to 360° C.

22. A cured product comprising a resin composition according to any one of 1 to 21.

23. A prepreg comprising:
a base material; and
a resin composition according to any one of 1 to 21 impregnated into or coated on the base material.

24. A laminate obtained by laminate-molding a prepreg according to 23.

25. A metal foil-clad laminate obtained by laminate-molding a prepreg according to 23 and a metal foil.

26. A laminate obtained by laminating a prepreg according to 23, and curing the prepreg at a temperature of 100 to 300° C. for 0.05 to 5 hours.

27. A metal foil-clad laminate obtained by laminating a prepreg according to 23 and a metal foil, and curing the prepreg and the metal foil at a temperature of 100 to 300° C. for 0.05 to 5 hours.

28. A method for producing a laminate comprising the steps of:
laminating a prepreg according to 23; and
heating the prepreg at a temperature of 100 to 300° C. for 0.05 to 5 hours.

29. A method for producing a metal foil-clad laminate comprising the steps of:
laminating a prepreg according to 23 and a metal foil; and
heating the prepreg and the metal foil at a temperature of 100 to 300° C. for 0.05 to 5 hours.

Advantageous Effect of Invention

A metal foil-clad laminate according to the present invention has excellent flame retardance, low water absorption, a high glass transition temperature, and an excellent elastic modulus at high temperature, and is suitable for a material for printed wiring boards requiring high heat resistance and high reliability.

DESCRIPTION OF EMBODIMENT

Hereinafter, an embodiment of the present invention will be described. The following embodiment is exemplified to describe the present invention, and the present invention is not limited only to the embodiment.

Resin Composition

A resin composition according to the present invention contains a specific maleimide compound (A), a specific cyanate ester compound (B), a non-halogen epoxy resin (C), and an inorganic filler (D). In another aspect, the resin composition contains the non-halogen epoxy resin (C), the inorganic filler (D), and a BT resin (E) obtained by prepolymerizing the specific maleimide compound (A) and the specific cyanate ester compound (B). The resin composition may further contain other ingredients such as an imidazole compound (F), a silane coupling agent, and a wetting dispersing agent. The resin composition according to the present invention is suitably used for a cured product having a glass transition temperature of 260 to 360° C., and preferably 265 to 320° C. Hereinafter, individual ingredients constituting the resin composition will be described.

Maleimide Compound (A)

The maleimide compound (A) used in the present invention is represented by general formula (1):

[Formula 6]

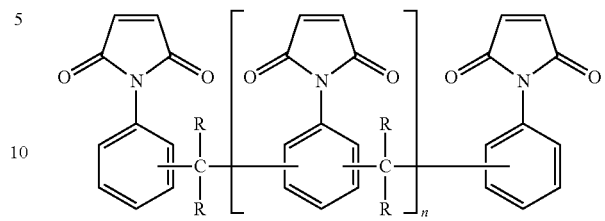

wherein R represents a hydrogen atom or a methyl group, and n represents an integer of 1 to 10 on average. Prepolymers thereof, and prepolymers of the maleimide compounds and the amine compounds, or the like can be used. Product examples include BMI-2300 manufactured by Daiwakasei Industry Co., Ltd. Because the compound has a novolac structure, the compound has many crosslinking points, and has an effect of raising the glass transition temperature of the cured product.

The content of the maleimide compound (A) is not particularly limited. However, from the viewpoint of a glass transition temperature and a water absorption ratio, the content is preferably in the range of 10 to 50 parts by mass based on 100 parts by mass in total of the maleimide compound (A), the cyanate ester compound (B), and the non-halogen epoxy resin (C), and more preferably in the range of 15 to 40 parts by mass.

Cyanate Ester Compound (B)

Any common publicly known cyanate ester compound can be used as the cyanate ester compound (B) used in the present invention. Examples thereof include a naphthol aralkyl-based cyanate ester compound, a novolac-based cyanate ester compound, 1,3-dicyanatobenzene, 1,4-dicyanatobenzene, 1,3,5-tricyanatobenzene, bis(3,5-dimethyl-4-cyanatophenyl)methane, 1,3-dicyanatonahthalene, 1,4-dicyanatonahthalene, 1,6-dicyanatonahthalene, 1,8-dicyanatonahthalene, 2,6-dicyanatonahthalene, 2,7-dicyanatonahthalene, 1,3,6-tricyanatonahthalene, 4,4'-dicyanatobiphenyl, bis(4-cyanatophenyl)methane, 2,2'-bis(4-cyanatophenyl)propane, bis(4-cyanatophenyl)ether, bis(4-cyanatophenyl)thioether, bis(4-cyanatophenyl)sulfone, 2,2'-bis(4-cyanatophenyl)propane, bis(3,5-dimethyl-4-cyanatophenyl)methane, and a phenol novolac-based cyanate ester compound. Of these, from the viewpoint of flame retardance, the naphthol aralkyl-based cyanate ester compound and/or the novolac-based cyanate ester compound are preferable. Furthermore, from the viewpoint of a water absorption ratio, a naphthol aralkyl-based cyanate ester compound represented by the following general formula (2) is more preferable.

[Formula 7]

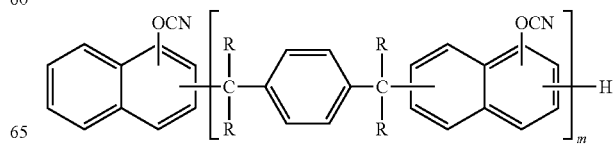

wherein R represents a hydrogen atom or a methyl group, and m represents an integer of 1 to 10 on average.

The naphthol aralkyl-based cyanate ester compound can be selected from naphthol aralkyl-based cyanate ester compounds obtained by condensation of a cyanic acid and a naphthol aralkyl resin which is obtained by a reaction of a naphthol such as α-naphthol or β-naphthol with p-xylyleneglycol, α,α'-dimethoxy-p-xylene, 1,4-di(2-hydroxy-2-propyl)benzene or the like.

The method of producing the cyanate ester compound is not particularly limited. The cyanate ester compound may be produced by any of methods known as a cyanate ester synthesis. Specifically, for example, the cyanate ester compound can be obtained by reacting a naphthol aralkyl resin represented by general formula (4) with a cyanogen halide in an inactive organic solvent in the presence of a basic compound. It is possible to adopt a method in which a salt of a similar naphthol aralkyl resin and a basic compound is formed in a solution containing water and then the salt is reacted with a cyanogen halide in a two-phase interface reaction, thereby synthesizing the cyanate ester compound.

[Formula 8]

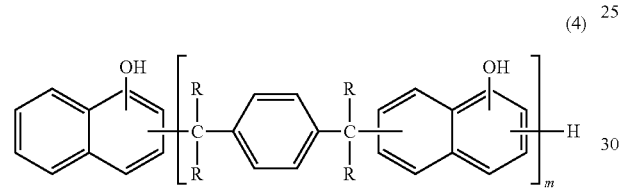

(4)

wherein R represents a hydrogen atom or a methyl group, and m represents an integer of 1 to 50 on average.

The content of the cyanate ester compound (B) is not particularly limited. From the viewpoint of flame retardance, a glass transition temperature, a water absorption ratio, and an elastic modulus, the content of the cyanate ester compound (B) is preferably in the range of 10 to 50 parts by mass based on 100 parts by mass in total of the maleimide compound (A), the cyanate ester compound (B), and the non-halogen epoxy resin (C), and more preferably in the range of 20 to 40 parts by mass.

The content of the cyanate ester compound (B) is not particularly limited. However, from the viewpoint of heat resistance, flame retardance, and a water absorption ratio, the cyanate ester compound (B) is preferably contained in an amount that meets a requirement of a ratio (CN/Ep) of 0.7 to 2.5, wherein CN represents the number of cyanate groups in the cyanate ester compound; and Ep represents the number of epoxy groups of an epoxy resin in the resin composition.

Non-Halogen Epoxy Resin (C)

The non-halogen epoxy resin (C) used in the present invention is not particularly limited so long as it is a compound which has two or more epoxy groups per molecule and does not have a halogen atom in a molecule structure. Examples thereof include a bisphenol A-based epoxy resin, a bisphenol F-based epoxy resin, a phenol novolac-based epoxy resin, a cresol novolac-based epoxy resin, a bisphenol A novolac-based epoxy resin, a trifunctional phenol-based epoxy resin, a tetrafunctional phenol-based epoxy resin, a naphthalene-based epoxy resin, an anthracene-based epoxy resin, a biphenyl-based epoxy resin, an aralkyl novolac-based epoxy resin, an alicyclic epoxy resin, a polyol-based epoxy resin, glycidyl amine, glycidyl ester, a compound obtained by epoxidation of a double bond of butadiene or the like, and a compound obtained by a reaction of a hydroxyl-group-containing silicon resin with epichlorohydrin.

Of these, a phenol biphenyl aralkyl-based epoxy resin, a phenol novolac-based epoxy resin, a cresol novolac-based epoxy resin, a polyoxynaphthylene-based epoxy resin, a tetrafunctional naphthalene-based epoxy resin, and an anthracene-based epoxy resin are preferable to particularly improve flame retardance. A phenol phenyl aralkyl novolac-based epoxy resin represented by general formula (5), a phenol biphenyl aralkyl-based epoxy resin represented by general formula (6), a naphthol aralkyl-based epoxy resin represented by general formula (7), and a polyoxynaphthylene-based epoxy resin are more preferable. The non-halogen epoxy resins (C) can be used alone or in a mixture of two or more of them, as required.

[Formula 9]

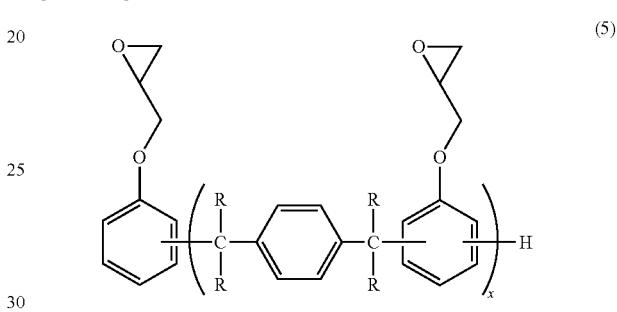

(5)

wherein R represents a hydrogen atom or a methyl group, and x represents an integer of 1 to 10 on average.

[Formula 10]

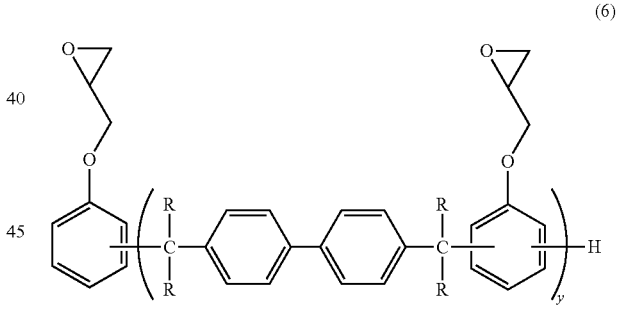

(6)

wherein R represents a hydrogen atom or a methyl group, and y represents an integer of 1 to 50 on average.

[Formula 11]

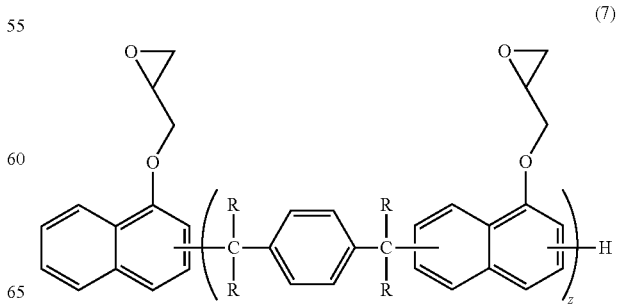

(7)

wherein R represents a hydrogen atom or a methyl group, and z represents an integer of 1 to 50 on average.

Furthermore, when flame retardance is particularly required, phosphorus-containing epoxy resins or brominated epoxy resins may be used in a combination with the non-halogen epoxy resin depending upon applications. The brominated epoxy resin means a bromine atom-containing compound having two or more epoxy groups per molecule. Specific examples include a brominated bisphenol A-based epoxy resin and a brominated phenol novolac-based epoxy resin.

The content of the non-halogen epoxy resin (C) is not particularly limited. However, from the viewpoint of flame retardance, a glass transition temperature, a water absorption ratio, and an elastic modulus, the content is preferably in the range of 5 to 50 parts by mass based on 100 parts by mass in total of the maleimide compound (A), the cyanate ester compound (B), and the non-halogen epoxy resin (C), and more preferably in the range of 10 to 40 parts by mass. When the BT resin (E) is used, the content of the non-halogen epoxy resin (C) is not particularly limited. However, the content is preferably in the range of 5 to 50 parts by mass based on 100 parts by mass in total of the non-halogen epoxy resin (C) and the BT resin (E), and more preferably in the range of 10 to 40 parts by mass.

The content of the non-halogen epoxy resin (C) is not particularly limited. However, from the viewpoint of flame retardance and curability or the like, it is preferable that the cyanate ester compound (B) and the non-halogen epoxy resin (C) are blended in the resin composition such that the ratio (CN/Ep) of the number of cyanate groups of the cyanate ester compound (B) and the number of epoxy groups of the non-halogen epoxy resin (C) is 0.7 to 2.5.

Inorganic Filler (D)

As the inorganic filler (D) used in the present invention, an inorganic filler generally used for the resin composition for electric wiring boards can be used. Specific examples thereof include silica such as natural silica, fused silica, amorphous silica, and hollow silica, metal hydrates such as aluminum hydroxide, a heat-treated product of aluminum hydroxide (obtained by heat-treating aluminum hydroxide and decreasing crystal water partially), boehmite, and magnesium hydroxide, molybdenum compounds such as molybdenum oxide and zinc molybdate, zinc borate, zinc stannate, alumina, clay, kaolin, talc, calcined clay, calcined kaolin, calcined talc, mica, short glass fiber (fine powders of glasses such as E glass or D glass), hollow glass, and spherical glass. The inorganic fillers (D) can be used alone or in a mixture of two or more of them, as required. Of these, from the viewpoint of a coefficient of thermal expansion and burning resistance, the silica, the boehmite, the magnesium hydroxide, the alumina, and the talc are preferable, and the boehmite and the silica are more preferable.

The mean particle diameter (D50) of the inorganic filler (D) is not particularly limited. However, from the viewpoint of dispersibility, the mean particle diameter (D50) is preferably 0.2 to 5 μm. Herein, D50 means a median diameter, and is a particle diameter at which, when the particle size distribution of the measured powder is divided into two parts, particles larger than the particle diameter and particles smaller than the particle diameter, the number or mass of the larger side of the particles or the number or mass of the smaller side of the particles accounts for 50% of that of the whole powder. The D50 of the inorganic filler is generally measured by a wet laser diffraction scattering method.

The content of the inorganic filler (D) is not particularly limited. However, the content is preferably 50 to 400 parts by mass based on 100 parts by mass in total of the maleimide compound (A), the cyanate ester compound (B), and the non-halogen epoxy resin (C). Furthermore, the content is particularly preferably 80 to 300 parts by mass. When the BT resin (E) is used, the content of the inorganic filler (D) is not particularly limited. However, the content is preferably 50 to 400 parts by mass based on 100 parts by mass in total of the non-halogen epoxy resin (C) and the BT resin (E). Furthermore, the content is particularly preferably 80 to 300 parts by mass. This is because the flame retardance can be further improved if the content of the inorganic filler is 50 parts by mass or more, and moldability and drilling workability are better if the content is 400 parts by mass or less.

BT Resin (E)

The BT resin (bismaleimide triazine resin) (E) used in the present invention is obtained by heat melting and mixing of the maleimide compound (A) represented by general formula (1) and the cyanate ester compound (B) in the absence of a solvent, or heat mixing after dissolution of the maleimide compound (A) and the cyanate ester compound (B) in an organic solvent such as methyl ethyl ketone, N-methyl pyrrodoline, dimethylformamide, dimethylacetamide, toluene, or xylene, and prepolymerizing the mixture.

When the BT resin (E) is produced, the content of the maleimide compound (A) is not particularly limited. However, from the viewpoint of a glass transition temperature, flame retardance, and curability, the content is preferably in the range of 5 to 75 parts by mass based on 100 parts by mass of the BT resin (E), and particularly preferably in the range of 10 to 70 parts by mass. The range of the molecular weight of the BT resin (E) is not particularly limited. However, from the viewpoint of handleability, a glass transition temperature, and curability, the number average molecular weight is preferably in the range of about 100 to 100000.

The content of the BT resin (E) is not particularly limited. However, from the viewpoint of heat resistance and a water absorption ratio, the content is preferably in the range of 20 to 80 parts by mass based on 100 parts by mass in total of the non-halogen epoxy resin (C) and the BT resin (E), more preferably in the range of 25 to 75 parts by weight, and particularly preferably 30 to 70 parts by mass.

Imidazole Compound (F)

The imidazole compound (F) used in the present invention is represented by general formula (3):

[Formula 2]

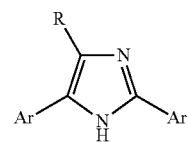

(3)

wherein Ar is a phenyl group, a naphthalene group, a biphenyl group, an anthracene group or, a hydroxyl group modified substance thereof, and R is a hydrogen atom, an alkyl group, an aryl group, or a hydroxyl group modified substance thereof. The imidazole compound (F) is added to the resin composition, and thereby the curing can be promoted, and the glass transition temperature of the cured product can be raised. The elastic modulus of the cured product can also be raised. In general formula (3), the imidazole substituent Ar is preferably the phenyl group, the naphthalene group, the biphenyl group, the anthracene group or, the hydroxyl group modified substance thereof or the like, and more preferably the phenyl group. The imidazole substituent R is preferably the hydrogen atom, the alkyl group, the aryl group, or the hydroxyl group modified substance thereof, and more preferably the aryl group such as the phenyl group. Furthermore, both the Ar group and the R group are particularly preferably the phenyl group.

The content of the imidazole compound (F) represented by general formula (3) is not particularly limited. However, from the viewpoint of the storage stability of a prepreg, and moldability when the prepreg is processed to a copper-clad laminate, the content is preferably in the range of 0.01 to 10 parts by mass based on 100 parts by mass in total of the maleimide compound (A), the cyanate ester compound (B), and the non-halogen epoxy resin (C), and more preferably in the range of 0.1 to 5 parts by mass. When the BT resin (E) is used, the content of the imidazole compound (F) is not particularly limited. However, the content is preferably in the range of 0.01 to 10 parts by mass based on 100 parts by mass in total of the non-halogen epoxy resin (C) and the BT resin (E), and more preferably in the range of 0.1 to 5 parts by mass.

Other Ingredients

The resin composition according to the present invention may further contain other ingredients such as a silane coupling agent and a wetting dispersing agent. The dispersibility of the inorganic filler, and the adhesive strength of the resin and the inorganic filler or the glass cloth can be improved by jointly using the silane coupling agent and the wetting dispersing agent in addition to the inorganic filler (D).

The silane coupling agent is not particularly limited so long as it is selected from silane coupling agents which are generally used for surface-treating inorganic substances. Specific examples thereof include aminosilane coupling agents such as γ-aminopropyltriethoxysilane and N-β-(aminoethyl)-γ-aminopropyltrimethoxysilane, epoxysilane coupling agents such as γ-glycidoxypropyltrimethoxysilane, vinylsilane coupling agents such as γ-methacryloxypropyltrimethoxysilane, cationic silane coupling agents such as N-β-(N-vinylbenzylaminoethyl)-γ-aminopropyltrimethoxysilane hydrochloride, and phenylsilane coupling agents. The silane coupling agents can be used alone or in a combination of two or more of them, as required.

The wetting dispersing agent is not particularly limited so long as it is selected from dispersion stabilizers which are used for coatings. Examples thereof include wetting dispersing agents such as Disperbyk-110, 111, 180, and 161, and BYK-W996, W9010, and W903 manufactured by BYK-Chemie Japan K.K.

The resin composition according to the present invention may further contain a maleimide compound having a structure other than the structure represented by general formula (1), so long as the desired properties of the resin composition are not impaired. Any compound having one or more maleimide groups per molecule may be used as the maleimide compound without particular limitation. Examples thereof include N-phenylmaleimide, N-hydroxyphenylmaleimide, bis(4-maleimidophenyl)methane, 2,2-bis{4-(4-maleimidophenoxy)-phenyl}propane, bis(3,5-dimethyl-4-maleimidophenyl)methane, bis(3-ethyl-5-methyl-4-maleimidophenyl)methane, bis(3,5-diethyl-4-maleimidophenyl)methane, prepolymers of these maleimide compounds, or prepolymers of maleimide compounds and amine compounds. The maleimide compounds can be used in a mixture of two or more of them, as required.

The resin composition according to the present invention may further contain a cyanate ester compound having a structure other than the structure represented by general formula (2), so long as the desired properties of the resin composition are not impaired. Any common publicly known cyanate ester resin may be used as the cyanate ester compound. Examples thereof include 1,3-dicyanatobenzene, 1,4-dicyanatobenzene, 1,3,5-tricyanatobenzene, bis(3,5-dimethyl-4-cyanatophenyl)methane, 1,3-dicyanatonahthalene, 1,4-dicyanatonahthalene, 1,6-dicyanatonahthalene, 1,8-dicyanatonahthalene, 2,6-dicyanatonahthalene, 2,7-dicyanatonahthalene, 1,3,6-tricyanatonahthalene, 4,4'-dicyanatobiphenyl, bis(4-cyanatophenyl)methane, 2,2'-bis(4-cyanatophenyl)propane, bis(4-cyanatophenyl)ether, bis(4-cyanatophenyl)thioether, bis(4-cyanatophenyl)sulfone, 2,2'-bis(4-cyanatophenyl)propane, bis(3,5-dimethyl-4-cyanatophenyl)methane, and phenol novolac-based cyanate esters. Those cyanate ester compounds can be used in a mixture of two or more of them, as required.

The resin composition according to the present invention may further contain other curing accelerators in addition to the imidazole compound (F), so long as the desired properties of the resin composition are not impaired. Examples of the compounds include organic peroxides such as benzoyl peroxide, lauroyl peroxide, acetyl peroxide, parachlorobenzoyl peroxide, and di-tert-butyl-di-perphthalate; azo compounds such as azobisnitrile; tertiary amines such as N,N-dimethylbenzylamine, N,N-dimethylaniline, N,N-dimethyltoluidine, 2-N-ethylanilinoethanol, tri-n-butylamine, pyridine, quinoline, N-methylmorpholine, triethanolamine, triethylenediamine, tetramethylbutanediamine, and N-methylpiperidine; phenols such as phenol, xylenol, cresol, resorcin, and catechol; organic metal salts such as lead naphthenate, lead stearate, zinc naphthenate, zinc octylate, tin oleate, dibutyltin maleate, manganese naphthenate, cobalt naphthenate, and acetylacetone iron; a substance obtained by dissolving any one of these organic metal salts in a hydroxyl-group-containing compound such as phenol or bisphenol; inorganic metal salts such as tin chloride, zinc chloride, and aluminum chloride; and organotin compounds such as dioctyltin oxide, other alkyltin, and alkyltin oxide.

The resin composition according to the present invention may further contain a silicone powder. The silicone powder retards a combustion time and functions as a flame retardant assistant which increases a flame resistant effect. The silicone powder includes a fine powder of polymethylsilsesquioxane where a siloxane bond is three-dimensionally reticulately cross-linked; a fine powder of an addition polymer of a vinyl-group-containing dimethylpolysiloxane and methylhydrogenpolysiloxane; a powder obtained by coating the surface of a fine powder of an addition polymer of a vinyl-group-containing dimethylpolysiloxane and methylhydrogenpolysiloxane with polymethylsilsesquioxane where a siloxane bond is three-dimensionally reticulately cross-linked; and a powder obtained by coating the surface of an inorganic support with polymethylsilsesquioxane where a siloxane bond is three-dimensionally reticulately cross-linked; or the like.

The mean particle diameter (D50) of the silicone powder is not particularly limited. However, the mean particle diameter (D50) is preferably 1 to 15 μm in view of dispersibility.

The content of the silicone powder is not particularly limited. However, from the viewpoint of moldability and dispersibility, the content is preferably in the range of 3 to 120 parts by mass based on 100 parts by mass in total of the maleimide compound (A), the cyanate ester compound (B), and the non-halogen epoxy resin (C), and particularly preferably in the range of 3 to 60 parts by mass.

The resin composition according to the present invention may further contain a variety of high polymer compounds such as a different thermosetting resin, a thermoplastic resin, and oligomers thereof, and elastomers; a different flame retardant compound; and an additive or the like, so long as the desired properties of the resin composition are not impaired. These compounds and additive are not particularly limited so long as these compounds and additive are selected from those which are generally used. Examples of the flame retardant compound include a nitrogen-containing compound such as melamine or benzoguanamine, and an oxazine-ring-containing compound. Examples of the additive include an ultraviolet absorber, an antioxidant, a photopolymerization initiator, a fluorescent brightener, a photosensitizer, a dye, a pigment, a thickener, a lubricant, an antifoamer, a dispersing agent, a leveling agent, a brightener, and a polymerization inhibitor. These can be used in a combination as required.

Prepreg

The prepreg according to the present invention is produced by impregnating or coating the base material with the resin composition. A method for producing the prepreg according to the present invention is not particularly limited so long as it is selected from methods for impregnating or coating the base material with the resin composition containing the resin ingredient in the present invention to produce the prepreg. The prepreg may be produced, for example, by a method for producing a prepreg comprising impregnating or coating the base material with a resin varnish comprising the resin composition containing the maleimide compound (A), the cyanate ester compound (B), the non-halogen epoxy resin (C), and the inorganic filler (D), and an organic solvent, and then heating the impregnated or coated base material in a drier of 100 to 200° C. for 1 to 60 minutes to semi-cure the resin. The amount of the resin composition deposited on the base material (F) is preferably in the range of 20 to 90% by mass based on the whole prepreg.

The base material used in the prepreg of the present invention can be selected from known base materials which are used for a variety of printed wiring board materials. Examples thereof include glass fibers such as E glass, D glass, S glass, NE glass, T glass, and Q glass, inorganic fibers other than glass, and organic fibers such as polyimide, polyamide and polyester. It is possible to select the base material in accordance with intended use or performance as required. Examples of the form of the base material include a woven fabric, a nonwoven fabric, roving, a chopped strand mat, or a surfacing mat. The thickness of the base material is not particularly limited. However, the thickness of the base material to be used is generally about 0.01 to 0.30 mm. Among these base materials, the E-glass fiber is particularly preferably used from the viewpoint of a balance between the coefficient of thermal expansion in a plane direction and the drilling workability. The woven fabric is preferably used as the form.

The organic solvent is used to lower the viscosity of the resin composition, improve the handleability, and, at the same time, enhance the impregnation of the resin composition into the glass cloth. The organic solvent is not particularly limited so long as the maleimide compound (A), the cyanate ester compound (B), and the non-halogen epoxy resin (C) can be dissolved therein. Specific examples thereof include ketones such as acetone, methyl ethyl ketone, methyl isobutyl ketone, and cyclohexanone; aromatic hydrocarbons such as benzene, toluene, and xylene; and amides such as dimethylformamide and dimethylacetamide.

Laminate

The laminate according to the present invention is obtained by laminate-molding the above-mentioned prepreg. The metal foil-clad laminate according to the present invention is obtained by laminate-molding the above-mentioned prepreg and a metal foil. Specifically, the laminate or metal-foil-clad laminate is produced by providing one prepreg mentioned above or stacking two or more prepregs, disposing a metal foil such as copper or aluminum on one surface or both surfaces of the prepreg or the stack of the prepregs, as required, and laminate-molding the resultant set. The metal foil to be used is not particularly limited so long as it is selected from metal foils which are used as a printed wiring board material. General technical skills for laminates and multilayer boards for printed wiring boards can be applied with regard to molding conditions. For example, a multiplaten press, a multiplaten vacuum press, continuous molding, and an autoclave molding machine or the like are generally used. The temperature is generally in the range of 100 to 300° C. The pressure is generally in the range of 2 to 100 kgf/cm$^2$. The heating time is generally in the range of 0.05 to 5 hours. The laminate is preferably cured and molded at a temperature of 120 to 280° C. for 0.1 to 4 hours, and more preferably at a temperature of 150 to 250° C. for 0.5 to 3 hours. A multilayer board can be produced by combining the prepreg of the present invention and a wiring board, prepared separately, for an internal layer, and laminate-molding the prepreg and the wiring board.

Hereinafter, the present invention is specifically described according to Synthesis Examples and Examples. However, the present invention is not limited to these Examples.

EXAMPLES

Synthesis Example 1

Synthesis of α-Naphthol Aralkyl-Based Cyanate Ester Compound

A reactor equipped with a thermometer, a stirrer, a dropping funnel, and a reflux condenser was preliminarily cooled with brine to 0 to 5° C. 7.47 g (0.122 mol) of Cyanogen chloride, 9.75 g (0.0935 mol) of 35% hydrochloric acid, 76 ml of water, and 44 ml of methylene chloride were charged into the reactor. The temperature within the reactor and pH were kept at −5 to +5° C. and 1 or less, respectively, and, while stirring, a solution of 20 g (0.0935 mol) of an α-naphthol aralkyl resin in which all R's in general formula (4) were hydrogen atoms (SN485, OH group equivalent: 214 g/eq., softening point: 86° C., manufactured by Nippon Steel Chemical Co., Ltd.), and 14.16 g (0.14 mol) of triethylamine dissolved in 92 ml of methylene chloride was added dropwise to the contents in the reactor through a dropping funnel over a time period of 1 hour. After the completion of the dropwise addition, 4.72 g (0.047 mol) of triethylamine was further added dropwise thereto over a time period of 15 minutes.

After the completion of the dropwise addition of the triethylamine, the mixture was stirred at the same temperature for 15 minutes, followed by separation of the reaction solution, thereby obtaining an organic layer. The obtained organic layer was washed twice with 100 ml of water. Methylene chloride was then removed by distillation under the reduced pressure with an evaporator, and the residue was finally concentrated to dryness at 80° C. for 1 hour, thereby obtaining 23.5 g of a cyanate ester compound of an α-naphthol aralkyl resin (α-naphthol aralkyl-based cyanate ester resin).

Synthesis Example 2

Synthesis of BT Resin (1)

36 parts by mass of the α-naphthol aralkyl-based cyanate ester resin (cyanate equivalent: 261 g/eq.) prepared in Synthesis Example 1 and 24 parts by mass of a maleimide compound in which all R's were hydrogen atoms and n was 0 to 1 in general formula (1) (BMI-2300, manufactured by Daiwakasei Industry Co., Ltd.) were dissolved in dimethylacetamide. The resultant solution was reacted at 150° C. while stirring, thereby obtaining a BT resin.

Synthesis Example 3

Synthesis of BT Resin (2)

30 parts by mass of the α-naphthol aralkyl-based cyanate ester resin (cyanate equivalent: 261 g/eq.) prepared in Synthesis Example 1 and 30 parts by mass of the maleimide compound (BMI-2300, manufactured by Daiwakasei Industry Co., Ltd.) used in Synthesis Example 2 were dissolved in dimethylacetamide. The resultant solution was reacted at 150° C. while stirring, thereby obtaining a BT resin.

Example 1

36 parts by mass of the α-naphthol aralkyl-based cyanate ester resin (cyanate equivalent: 261 g/eq.) prepared in Synthesis Example 1, 24 parts by mass of the maleimide compound (BMI-2300, manufactured by Daiwakasei Industry Co., Ltd.) used in Synthesis Example 2, and 40 parts by mass of a phenol biphenyl aralkyl-based epoxy resin (NC-3000-FH, epoxy equivalent: 321 g/eq., manufactured by Nippon Kayaku Co., Ltd.) were dissolved and mixed in methyl ethyl ketone. 1 part by mass of a wetting dispersing agent (disperbyk-w903, manufactured by BYK-Chemie Japan K.K.), 120 parts by mass of boehmite (APYRAL AOH60, manufactured by Nabaltec), and 0.02 part by mass of zinc octylate (NIKKA OCTHIX zinc, manufactured by Nihon Kagaku Sangyo Co., Ltd.) were further mixed, thereby obtaining a varnish. The varnish was diluted with methyl ethyl ketone. The diluted varnish was impregnated into and coated on a 0.1 mm-thick E glass woven fabric. The impregnated and coated E-glass woven fabric was dried under heat at 160° C. for 4 minutes, thereby obtaining a prepreg having a resin content of 50% by mass.

Example 2

1 part by mass of 2,4,5-triphenyl imidazole (manufactured by Wako Pure Chemical Industries, Ltd.) was mixed with the varnish prepared in Example 1. The varnish was diluted with methyl ethyl ketone. The diluted varnish was then impregnated into and coated on a 0.1 mm-thick E-glass woven fabric. The impregnated and coated varnish was dried under heat at 160° C. for 4 minutes, thereby obtaining a prepreg having a resin content of 50% by mass.

Example 3

A prepreg was obtained in the same manner as in Example 1 except that 40 parts by mass of the phenol biphenyl aralkyl-based epoxy resin was replaced with 36 parts by mass, and 4 parts by mass of a tetrafunctional naphthalene-based epoxy resin (EPICLON EXA-4710, epoxy equivalent: 170 g/eq., manufactured by DIC) and 10 parts by mass of a silicone rubber powder having a surface coated with a silicone resin (KMP-600, manufactured by Shin-Etsu Chemical Co., Ltd.) were added.

Example 4

1 part by mass of 2,4,5-triphenyl imidazole used in Example 2 was mixed with the varnish prepared in Example 3. The varnish was diluted with methyl ethyl ketone. The diluted varnish was then impregnated into and coated on a 0.1 mm-thick E-glass woven fabric. The impregnated and coated varnish was dried under heat at 160° C. for 4 minutes, thereby obtaining a prepreg having a resin content of 50% by mass.

Example 5

A prepreg was obtained in the same manner as in Example 1 except that 0.02 part by mass of manganese octylate (NIKKA OCTHIX manganese, manufactured by Nihon Kagaku Sangyo Co., Ltd.) was used instead of zinc octylate.

Example 6

1 part by mass of 2,4,5-triphenyl imidazole used in Example 2 was mixed with the varnish prepared in Example 5. The varnish was diluted with methyl ethyl ketone. The diluted varnish was then impregnated into and coated on a 0.1 mm-thick E-glass woven fabric. The impregnated and coated varnish was dried under heat at 160° C. for 4 minutes, thereby obtaining a prepreg having a resin content of 50% by mass.

Example 7

A prepreg was obtained in the same manner as in Example 1 except that 36 parts by mass of the α-naphthol aralkyl-based cyanate ester resin was replaced with 32 parts by mass; 40 parts by mass of the phenol biphenyl aralkyl-based epoxy resin was replaced with 36 parts by mass; and 24 parts by mass of the maleimide compound was replaced with 32 parts by mass.

Example 8

1 part by mass of 2,4,5-triphenyl imidazole used in Example 2 was mixed with the varnish prepared in Example 7. The varnish was diluted with methyl ethyl ketone. The diluted varnish was then impregnated into and coated on a 0.1 mm-thick E-glass woven fabric. The impregnated and coated varnish was dried under heat at 160° C. for 4 minutes, thereby obtaining a prepreg having a resin content of 50% by mass.

Example 9

A prepreg was obtained in the same manner as in Example 1 except that 36 parts by mass of the α-naphthol aralkyl-based cyanate ester resin was replaced with 39 parts by mass; 40 parts by mass of the phenol biphenyl aralkyl-based epoxy resin was replaced with 20 parts by mass; 24 parts by mass of the maleimide compound was replaced with 26 parts by mass; and 15 parts by mass of a phenol novolac-based epoxy resin (N770, epoxy equivalent: 190 g/eq., manufactured by DIC) was used.

Example 10

1 part by mass of 2,4,5-triphenyl imidazole used in Example 2 was mixed with the varnish prepared in Example 9. The varnish was diluted with methyl ethyl ketone. The diluted varnish was then impregnated into and coated on a 0.1 mm-thick E-glass woven fabric. The impregnated and coated varnish was dried under heat at 160° C. for 4 minutes, thereby obtaining a prepreg having a resin content of 50% by mass.

Example 11

A prepreg was obtained in the same manner as in Example 1 except that 36 parts by mass of the α-naphthol aralkyl-based cyanate ester resin was replaced with 39 parts by mass; 40 parts by mass of the phenol biphenyl aralkyl-based epoxy resin was replaced with 20 parts by mass; 24 parts by mass of the maleimide compound was replaced with 26 parts by mass; and 15 parts by mass of a cresol novolac-based epoxy resin (N680, epoxy equivalent: 285 g/eq., manufactured by DIC) was used.

Example 12

1 part by mass of 2,4,5-triphenyl imidazole used in Example 2 was mixed with the varnish prepared in Example 11. The varnish was diluted with methyl ethyl ketone. The diluted varnish was then impregnated into and coated on a 0.1 mm-thick E-glass woven fabric. The impregnated and coated varnish was dried under heat at 160° C. for 4 minutes, thereby obtaining a prepreg having a resin content of 50% by mass.

Example 13

A prepreg was obtained in the same manner as in Example 1 except that 40 parts by mass of the phenol biphenyl aralkyl-based epoxy resin was replaced with 20 parts by mass, and 20 parts by mass of a polyoxynaphthylene-based epoxy resin (EXA-7311, epoxy equivalent: 277 g/eq., manufactured by DIC) was used.

Example 14

1 part by mass of 2,4,5-triphenyl imidazole used in Example 2 was mixed with the varnish prepared in Example 13. The varnish was diluted with methyl ethyl ketone. The diluted varnish was then impregnated into and coated on a 0.1 mm-thick E-glass woven fabric. The impregnated and coated varnish was dried under heat at 160° C. for 4 minutes, thereby obtaining a prepreg having a resin content of 50% by mass.

Example 15

A prepreg was obtained in the same manner as in Example 1 except that 40 parts by mass of the phenol biphenyl aralkyl-based epoxy resin was replaced with 36 parts by mass, and 4 parts by mass of the tetrafunctional naphthalene-based epoxy resin used in Example 3 was used.

Example 16

1 part by mass of 2,4,5-triphenyl imidazole used in Example 2 was mixed with the varnish prepared in Example 15. The varnish was diluted with methyl ethyl ketone. The diluted varnish was then impregnated into and coated on a 0.1 mm-thick E-glass woven fabric. The impregnated and coated varnish was dried under heat at 160° C. for 4 minutes, thereby obtaining a prepreg having a resin content of 50% by mass.

Example 17

60 parts by mass of the BT resin (bismaleimide triazine resin) obtained in Synthesis Example 2 and 40 parts by mass of the phenol biphenyl aralkyl-based epoxy resin used in Example 1 were dissolved and mixed in methyl ethyl ketone. 1 part by mass of the wetting dispersing agent used in Example 1, 120 parts by mass of the boehmite, and 0.02 part by mass of the zinc octylate were further mixed, thereby obtaining a varnish. The varnish was diluted with methyl ethyl ketone. The diluted varnish was impregnated into and coated on a 0.1 mm-thick E-glass woven fabric. The impregnated and coated E-glass woven fabric was dried under heat at 160° C. for 4 minutes, thereby obtaining a prepreg having a resin content of 50% by mass.

Example 18

60 parts by mass of the BT resin (bismaleimide triazine resin) prepared in Synthesis Example 3 and 40 parts by mass of the phenol biphenyl aralkyl-based epoxy resin were dissolved and mixed in methyl ethyl ketone. 1 part by mass of the wetting dispersing agent used in Example 1, 120 parts by mass of the boehmite, 0.02 part by mass of the zinc octylate, and 1 part by mass of 2,4,5-triphenyl imidazole were further mixed, thereby obtaining a varnish. The varnish was diluted with methyl ethyl ketone. The diluted varnish was impregnated into and coated on a 0.1 mm-thick E-glass woven fabric. The impregnated and coated E-glass woven fabric was dried under heat at 160° C. for 4 minutes, thereby obtaining a prepreg having a resin content of 50% by mass.

Example 19

10% by mass of a silicone resin powder (Tospearl 120, manufactured by Momentive Performance Materials Japan LLC) was mixed with the varnish prepared in Example 16. The varnish was diluted with methyl ethyl ketone. The diluted varnish was impregnated into and coated on a 0.1 mm-thick E-glass woven fabric. The impregnated and coated E-glass woven fabric was dried under heat at 160° C. for 4 minutes, thereby obtaining a prepreg having a resin content of 50% by mass.

Example 20

A prepreg was obtained in the same manner as in Example 2 except that 120 parts by mass of spherical fused silica (SC2500-SQ, manufactured by Admatex) was used instead of the boehmite.

Example 21

A prepreg was obtained in the same manner as in Example 9 except that 120 parts by mass of the spherical fused silica used in Example 20 was used instead of the boehmite.

Example 22

A prepreg was obtained in the same manner as in Example 15 except that 120 parts by mass of the spherical fused silica used in Example 20 was used instead of the boehmite.

Example 23

A prepreg was obtained in the same manner as in Example 22 except that 40 parts by mass of a polyoxynaphthylene-based epoxy resin (EXA-7311, epoxy equivalent: 277 g/eq., manufactured by DIC) was used instead of the phenol biphenyl aralkyl-based epoxy resin, and 10 parts by mass of the silicone rubber powder used in Example 3 was added.

Example 24

A prepreg was obtained in the same manner as in Example 23 except that 120 parts by mass of the spherical fused silica was replaced with 250 parts by mass.

Example 25

A prepreg was obtained in the same manner as in Example 23 except that 120 parts by mass of the spherical fused silica was replaced with 200 parts by mass, and 10 parts by mass of a silicone rubber powder used in Example 3 was replaced with 40 parts by mass.

Example 26

A prepreg was obtained in the same manner as in Example 1 except that 24 parts by mass of bis(3-ethyl-5-methyl-4-maleimidophenyl)methane (BMI-70, manufactured by K.I Chemical Industry Co., Ltd.) was used instead of the maleimide compound.

Example 27

A prepreg was obtained in the same manner as in Example 1 except that the boehmite was not used.

Example 28

A prepreg was obtained in the same manner as in Example 1 except that 36 parts by mass of a prepolymer of 2,2-bis(4-cyanatophenyl)propane (CA210, cyanate equivalent: 139, manufactured by Mitsubishi Gas Chemical Co., Inc.) was used instead of the α-naphthol aralkyl-based cyanate ester resin.

Example 29

A prepreg was obtained in the same manner as in Example 2 except that the prepolymer of 2,2-bis(4-cyanatophenyl)propane used in Example 28 was used instead of the α-naphthol aralkyl-based cyanate ester resin.

Example 30

A prepreg was obtained in the same manner as in Example 28 except that 36 parts by mass of the prepolymer of 2,2-bis(4-cyanatophenyl)propane was replaced with 24 parts by mass, and 24 parts by mass of the maleimide compound was replaced with 36 parts by mass.

Example 31

A prepreg was obtained in the same manner as in Example 1 except that 36 parts by mass of a novolac-based cyanate ester resin (Primaset PT-30, manufactured by LONZA JAPAN, cyanate equivalent: 254 g/eq.) was used instead of the α-naphthol aralkyl-based cyanate ester resin.

Example 32

The prepreg obtained in Example 31 was laminate-pressed, and then heated at 220° C. in a thermostatic chamber for 4 hours.

Example 33

A prepreg was obtained in the same manner as in Example 1 except that 30 parts by mass of the novolac-based cyanate ester resin used in Example 31 was used instead of the α-naphthol aralkyl-based cyanate ester resin, and 24 parts by mass of the maleimide compound was replaced with 30 parts by mass.

Example 34

A prepreg was obtained in the same manner as in Example 1 except that 24 parts by mass of bis(3-ethyl-5-methyl-4-maleimidophenyl)methane (BMI-70, manufactured by K.I Chemical Industry Co., Ltd.) was used instead of the maleimide compound, and 120 parts by mass of the spherical fused silica used in Example 20 was used instead of the boehmite.

Example 35

A prepreg was obtained in the same manner as in Example 1 except that 36 parts by mass of the prepolymer of 2,2-bis(4-cyanatophenyl)propane used in Example 28 was used instead of the α-naphthol aralkyl-based cyanate ester resin, and 120 parts by mass of the spherical fused silica used in Example 20 was used instead of the boehmite.

Preparation of Metal Foil-Clad Laminate

For each of the prepregs obtained in Examples 1 to 35, four sheets of the prepreg were superimposed on each other to constitute a stack. A 12 μm-thick electrolytic copper foil (3EC-III, manufactured by MITSUI MINING & SMELTING CO., LTD.) was disposed on the upper surface and the lower surface of the stack, followed by laminate-molding under conditions of a pressure of 30 kgf/cm$^2$, a temperature of 220° C., and a time of 120 minutes, thereby obtaining a metal foil-clad laminate having a 0.4 mm-thick insulating layer.

Tables 1 and 2 show the results obtained by evaluating flame retardance, a glass transition temperature, a water absorption ratio, and an elastic modulus for the obtained metal foil-clad laminates.

Evaluation Method of Physical Properties of Metal Foil-Clad Laminate

The copper foil was removed by etching the metal foil-clad laminate before the flame retardance, the glass transition temperature, the water absorption ratio, and the elastic modulus (250° C.) were evaluated by the following method.

Flame retardance: evaluated according to a UL94 vertical combustion testing method. Glass transition temperature: measured with a dynamic viscoelasticity analyzer (manufactured by TA INSTRUMENTS) according to JIS C 6481. Water absorption ratio: a sample which has a size of 50×50 mm and has been previously dried in a drier at 125° C. for 2 hours was allowed to stand under conditions of 121° C. and 2 atm for 5 hours with a pressure cooker testing apparatus (manufactured by HIRAYAMA PRODUCING CORPORATION), and a change in weight of the sample was then measured.

Bending elastic modulus (250° C.): measured at a temperature of 250° C. using Shimadzu Autograph (Model: AG-5kNIS, manufactured by Shimadzu Corporation) according to JIS C6481.

TABLE 1

|  | Example 1 | Example 2 | Example 3 | Example 4 | Example 5 | Example 6 | Example 7 |
|---|---|---|---|---|---|---|---|
| Flame retardance | V-0 | V-0 | V-0 | V-0 | V-0 | V-0 | V-0 |
| Glass transition temperature | 270 | 284 | 280 | 294 | 276 | 285 | 281 |
| Water absorption ratio | 0.49 | 0.51 | 0.51 | 0.53 | 0.49 | 0.51 | 0.53 |
| Bending elastic modulus (250° C.) | 16.4 | 17.0 | 16.0 | 16.5 | 17.0 | 18.0 | 17.0 |

|  | Example 8 | Example 9 | Example 10 | Example 11 | Example 12 | Example 13 | Example 14 |
|---|---|---|---|---|---|---|---|
| Flame retardance | V-0 | V-0 | V-0 | V-0 | V-0 | V-0 | V-0 |
| Glass transition temperature | 296 | 274 | 287 | 267 | 273 | 274 | 288 |
| Water absorption ratio | 0.55 | 0.52 | 0.53 | 0.52 | 0.53 | 0.54 | 0.55 |
| Bending elastic modulus (250° C.) | 18.2 | 16.7 | 17.8 | 16.3 | 16.8 | 16.7 | 17.8 |

|  | Example 15 | Example 16 | Example 17 | Example 18 | Example 19 | Example 20 | Example 21 |
|---|---|---|---|---|---|---|---|
| Flame retardance | V-0 | V-0 | V-0 | V-0 | V-0 | V-0 | V-0 |
| Glass transition temperature | 282 | 296 | 269 | 286 | 295 | 286 | 269 |
| Water absorption ratio | 0.50 | 0.51 | 0.49 | 0.50 | 0.54 | 0.49 | 0.53 |
| Bending elastic modulus (250° C.) | 17.2 | 18.1 | 16.4 | 17.2 | 16.2 | 17.6 | 16.4 |

|  | Example 22 | Example 23 | Example 24 | Example 25 |
|---|---|---|---|---|
| Flame retardance | V-0 | V-0 | V-0 | V-0 |
| Glass transition temperature | 281 | 302 | 301 | 302 |
| Water absorption ratio | 0.52 | 0.57 | 0.52 | 0.51 |
| Bending elastic modulus (250° C.) | 17.0 | 18.4 | 18.0 | 17.8 |

Unit
glass transition temperature: ° C.;
water absorption ratio: % by weight;
elastic modulus: GPa

TABLE 2

|  | Example 26 | Example 27 | Example 28 | Example 29 | Example 30 | Example 31 | Example 32 | Example 33 | Example 34 | Example 35 |
|---|---|---|---|---|---|---|---|---|---|---|
| Flame retardance | V-0 | burnout | V-1 | V-1 | V-1 | V-0 | V-0 | V-0 | V-0 | V-1 |
| Glass transition temperature | 249 | 250 | 224 | 232 | 242 | 240 | 289 | 252 | 248 | 228 |
| Water absorption ratio | 0.47 | 0.59 | 0.60 | 0.64 | 0.65 | 0.62 | 0.66 | 0.63 | 0.50 | 0.62 |
| Bending elastic modulus (250° C.) | 15.4 | 12.1 | 13.6 | 14.3 | 14.7 | 14.7 | 17.9 | 15.4 | 15.3 | 14.3 | unit
glass transition temperature: ° C.;
water absorption ratio: % by weight;
elastic modulus: GPa

The invention claimed is:
1. A resin composition comprising:
a maleimide compound (A) represented by general formula (1):

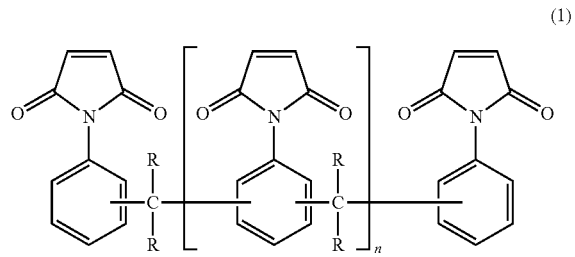

wherein R represents a hydrogen atom or a methyl group, and n represents an integer of 1 to 10 on average;
a cyanate ester compound (B);
a non-halogen epoxy resin (C);
an inorganic filler (D); and
an imidazole compound (F) represented by general formula (3):

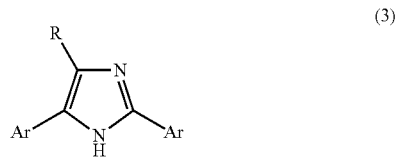

wherein Ar is a phenyl group, a naphthalene group, a biphenyl group, an anthracene group, or a hydroxyl group modified substance thereof, and R is a hydrogen atom, an alkyl group, an aryl group, or a hydroxyl group modified substance thereof.

2. The resin composition according to claim 1, wherein a content of the maleimide compound (A) is 10 to 50 parts by mass based on 100 parts by mass in total of the maleimide compound (A), the cyanate ester compound (B), and the non-halogen epoxy resin (C).

3. The resin composition according to claim 1, wherein a content of the cyanate ester compound (B) is 10 to 50 parts by mass based on 100 parts by mass in total of the maleimide compound (A), the cyanate ester compound (B), and the non-halogen epoxy resin (C).

4. The resin composition according to claim 1, wherein a content of the non-halogen epoxy resin (C) is 5 to 50 parts by mass based on 100 parts by mass in total of the maleimide compound (A), the cyanate ester compound (B), and the non-halogen epoxy resin (C).

5. The resin composition according to claim 1, wherein a content of the inorganic filler (D) is 50 to 400 parts by mass based on 100 parts by mass in total of the maleimide compound (A), the cyanate ester compound (B), and the non-halogen epoxy resin (C).

6. The resin composition according to claim 1, wherein a content of the imidazole compound (F) is 0.01 to 10 parts by mass based on 100 parts by mass in total of the maleimide compound (A), the cyanate ester compound (B), and the non-halogen epoxy resin (C).

7. A resin composition comprising:
a non-halogen epoxy resin (C);
an inorganic filler (D); and
a bismalemide triazine resin (E) obtained by prepolymerizing a maleimide compound (A) and a cyanate ester compound (B), the maleimide compound (A) represented by general formula (1):

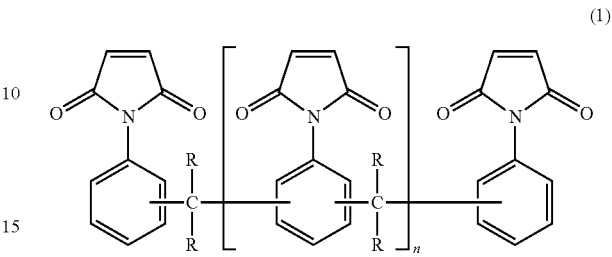

wherein R represents a hydrogen atom or a methyl group, and n represents an integer of 1 to 10 on average.

8. The resin composition according to claim 7, further comprising an imidazole compound (F) represented by general formula (3):

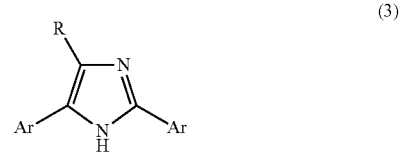

wherein Ar is a phenyl group, a naphthalene group, a biphenyl group, an anthracene group, or a hydroxyl group modified substance thereof, and R is a hydrogen atom, an alkyl group, an aryl group, or a hydroxyl group modified substance thereof.

9. The resin composition according to claim 7, wherein a content of the non-halogen epoxy resin (C) is 5 to 50 parts by mass based on 100 parts by mass in total of the non-halogen epoxy resin (C) and the bismalemide triazine resin (E).

10. The resin composition according to claim 7, wherein a content of the inorganic filler (D) is 50 to 400 parts by mass based on 100 parts by mass in total of the non-halogen epoxy resin (C) and the bismalemide triazine resin (E).

11. The resin composition according to claim 7, wherein a content of the bismalemide triazine resin (E) is 20 to 80 parts by mass based on 100 parts by mass in total of the non-halogen epoxy resin (C) and the bismalemide triazine resin (E).

12. The resin composition according to claim 7, wherein a content of the maleimide compound (A) is 5 to 75 parts by mass based on 100 parts by mass of the bismalemide triazine resin (E) when the bismalemide triazine resin (E) is produced.

13. The resin composition according to claim 8, wherein a content of the imidazole compound (F) is 0.01 to 10 parts by mass based on 100 parts by mass in total of the non-halogen epoxy resin (C) and the bismalemide triazine resin (E).

14. The resin composition according to claim 1, wherein the imidazole compound (F) is 2,4,5-triphenyl imidazole.

15. The resin composition according to claim 1, wherein the inorganic filler (D) is at least one selected from the group consisting of silica, boehmite, magnesium hydroxide, alumina, and talc.

16. The resin composition according to claim 1, wherein the inorganic filler (D) is the boehmite and/or the silica.

17. The resin composition according to claim 1, wherein the non-halogen epoxy resin (C) is at least one selected from the group consisting of a phenol biphenyl aralkyl-based epoxy resin, a phenol novolac-based epoxy resin, a cresol novolac-based epoxy resin, a polyoxynaphthylene-based epoxy resin, a tetrafunctional naphthalene-based epoxy resin, and an anthracene-based epoxy resin.

18. The resin composition according to claim 1, wherein the cyanate ester compound (B) is a naphthol aralkyl-based cyanate ester compound and/or a novolac-based cyanate ester compound.

19. The resin composition according to claim 1, wherein the cyanate ester compound (B) is a naphthol aralkyl-based cyanate ester compound represented by general formula (2):

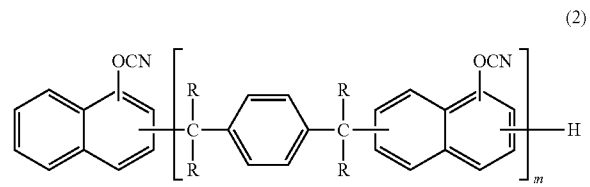

(2)

wherein R represents a hydrogen atom or a methyl group, and m represents an integer of 1 to 10 on average.

20. The resin composition according to claim 1 used for a cured product having a glass transition temperature of 260 to 360° C.

21. A cured product comprising a resin composition according to claim 1.

22. A prepreg comprising:
a base material; and
a resin composition according to claim 1 impregnated into or coated on the base material.

23. A laminate obtained by laminate-molding a prepreg according to claim 22.

24. A metal foil-clad laminate obtained by laminate-molding a prepreg according to claim 22 and a metal foil.

25. A laminate obtained by laminating a prepreg according to claim 22, and curing the prepreg at a temperature of 100 to 300° C. for 0.05 to 5 hours.

26. A metal foil-clad laminate obtained by laminating a prepreg according to claim 22 and a metal foil, and curing the prepreg and the metal foil at a temperature of 100 to 300° C. for 0.05 to 5 hours.

27. A method for producing a laminate comprising the steps of:
laminating a prepreg according to claim 22; and
heating the prepreg at a temperature of 100 to 300° C. for 0.05 to 5 hours.

28. A method for producing a metal foil-clad laminate comprising the steps of:
laminating a prepreg according to claim 22 and a metal foil; and
heating the prepreg and the metal foil at a temperature of 100 to 300° C. for 0.05 to 5 hours.

29. The resin composition according to claim 8, wherein the imidazole compound (F) is 2,4,5-triphenyl imidazole.

30. The resin composition according to claim 7, wherein the inorganic filler (D) is at least one selected from the group consisting of silica, boehmite, magnesium hydroxide, alumina, and talc.

31. The resin composition according to claim 7, wherein the inorganic filler (D) is the boehmite and/or the silica.

32. The resin composition according to claim 7, wherein the non-halogen epoxy resin (C) is at least one selected from the group consisting of a phenol biphenyl aralkyl-based epoxy resin, a phenol novolac-based epoxy resin, a cresol novolac-based epoxy resin, a polyoxynaphthylene-based epoxy resin, a tetrafunctional naphthalene-based epoxy resin, and an anthracene-based epoxy resin.

33. The resin composition according to claim 7, wherein the cyanate ester compound (B) is a naphthol aralkyl-based cyanate ester compound and/or a novolac-based cyanate ester compound.

34. The resin composition according to claim 7, wherein the cyanate ester compound (B) is a naphthol aralkyl-based cyanate ester compound represented by general formula (2):

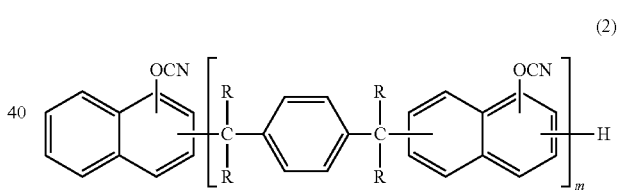

(2)

wherein R represents a hydrogen atom or a methyl group, and m represents an integer of 1 to 10 on average.

* * * * *